(12) United States Patent
Mori et al.

(10) Patent No.: US 11,624,011 B2
(45) Date of Patent: Apr. 11, 2023

(54) THERMOSETTING ADHESIVE SHEET AND SEMICONDUCTOR DEVICE MANUFACTURING METHOD

(71) Applicant: DEXERIALS CORPORATION, Tokyo (JP)

(72) Inventors: Daichi Mori, Tochigi (JP); Tomoyuki Ishimatsu, Tochigi (JP)

(73) Assignee: LINTEC CORPORATION, Tokyo (JP)

( * ) Notice: Subject to any disclaimer, the term of this patent is extended or adjusted under 35 U.S.C. 154(b) by 363 days.

(21) Appl. No.: 15/768,050

(22) PCT Filed: Dec. 13, 2016

(86) PCT No.: PCT/JP2016/087090
§ 371 (c)(1),
(2) Date: Apr. 13, 2018

(87) PCT Pub. No.: WO2017/104670
PCT Pub. Date: Jun. 22, 2017

(65) Prior Publication Data
US 2018/0320031 A1    Nov. 8, 2018

(30) Foreign Application Priority Data

Dec. 14, 2015  (JP) .............................. JP2015-243649

(51) Int. Cl.
*B32B 9/04* (2006.01)
*C09J 163/00* (2006.01)
(Continued)

(52) U.S. Cl.
CPC .............. *C09J 163/00* (2013.01); *B32B 9/04* (2013.01); *B32B 27/06* (2013.01); *C09J 7/10* (2018.01);
(Continued)

(58) Field of Classification Search
CPC ........ C09J 7/30; C09J 163/00; H01L 21/6836
See application file for complete search history.

(56) References Cited

U.S. PATENT DOCUMENTS 9,443,750 B2     9/2016  Shinoda et al.
2005/0208296 A1* 9/2005  Saiki ................. H01L 21/67132
                                                      156/701
(Continued)

FOREIGN PATENT DOCUMENTS

CN      104040696 A     9/2014
CN      104137229 A    11/2014
(Continued)

OTHER PUBLICATIONS

Steven C. Williams, "Elastomers and Rubbers—Is There A Difference?", 2021, ISM (Year: 2021).*
(Continued)

*Primary Examiner* — Jasper Saberi
(74) *Attorney, Agent, or Firm* — Oliff PLC (57) ABSTRACT

A thermosetting adhesive sheet capable of reducing semiconductor wafer warping and chipping and a method for manufacturing a semiconductor device includes a thermosetting adhesive layer formed from a resin composition containing a resin component and a filler, the resin component containing an epoxy compound and a curing agent, a total value obtained by multiplying the reciprocal of epoxy equivalent of the epoxy compound by content of the epoxy compound in the resin component being 1.15E−04 or more, and blending amount of the filler being 50 pts. mass or more with respect to 100 pts. mass of the resin component; the thermosetting adhesive sheet is applied to a ground surface of a semiconductor and cured before dicing.

11 Claims, 6 Drawing Sheets

(51) Int. Cl.

| | | |
|---|---|---|
| *C09J 7/10* | (2018.01) | |
| *H01L 23/00* | (2006.01) | |
| *C09J 11/04* | (2006.01) | |
| *C09J 11/06* | (2006.01) | |
| *C09J 11/08* | (2006.01) | |
| *H01L 21/304* | (2006.01) | |
| *C09J 7/30* | (2018.01) | |
| *B32B 27/06* | (2006.01) | |
| *H01L 21/683* | (2006.01) | |
| *C08K 3/013* | (2018.01) | |

(52) U.S. Cl.
CPC .................. *C09J 7/30* (2018.01); *C09J 11/04* (2013.01); *C09J 11/06* (2013.01); *C09J 11/08* (2013.01); *H01L 21/304* (2013.01); *H01L 21/6836* (2013.01); *H01L 23/562* (2013.01); *B32B 2457/14* (2013.01); *C08K 3/013* (2018.01); *C09J 2203/326* (2013.01); *C09J 2301/408* (2020.08); *C09J 2400/22* (2013.01); *C09J 2463/00* (2013.01); *H01L 2221/6834* (2013.01); *H01L 2221/68327* (2013.01)

(56) References Cited

U.S. PATENT DOCUMENTS

| | | | | |
|---|---|---|---|---|
| 2008/0242058 | A1* | 10/2008 | Ichikawa | H01L 24/29 438/464 |
| 2012/0129988 | A1* | 5/2012 | Fujimaru | H01L 24/83 524/114 |
| 2014/0295646 | A1* | 10/2014 | Shinoda | H01L 21/6836 438/464 |
| 2016/0167345 | A1 | 6/2016 | Saiki et al. | |
| 2016/0218077 | A1 | 7/2016 | Azuma et al. | |
| 2016/0272854 | A1 | 9/2016 | Wakioka | |
| 2017/0011949 | A1* | 1/2017 | Saiki | B32B 27/08 |

FOREIGN PATENT DOCUMENTS

| | | |
|---|---|---|
| JP | 2002-280329 A | 9/2002 |
| JP | 2013-181049 A | 9/2013 |
| JP | 2014-197675 A | 10/2014 |
| JP | 2015-032644 A | 2/2015 |
| WO | 2013/161864 A1 | 10/2013 |
| WO | 2015/046529 A1 | 4/2015 |
| WO | 2015/133386 A1 | 9/2015 |
| WO | 2015/145807 A1 | 10/2015 |

OTHER PUBLICATIONS

"High Performance Type Epoxy Resins", DIG, 2018, https://www.dic-global.com/en/products/epoxy/high_performance/ (Year: 2018).*
May 21, 2019 Office Action issued in Korean Patent Application No. 10-2018-7014970.
Mar. 27, 2020 Office Action issued in Chinese Patent Application No. 201680070228.5.
Feb. 28, 2017 International Search Report issued in International Patent Application No. PCT/JP2016/087090.
Jul. 16, 2019 Office Action issued in Japanese Patent Application No. 2015-243649.
Oct. 16, 2020 Office Action issued in Chinese Patent Application No. 201680070228.5.
May 20, 2020 Office Action issued in Chinese Patent Application No. 201680070276.4.
Greeting et al., "Coating Resin Chemistry," Chemical Industry Press, 1st Edition, p. 336, 2007.
Feb. 2, 2021 Office Action issued in Chinese Patent Application No. 201680070276.4.

* cited by examiner

THERMOSETTING ADHESIVE SHEET AND SEMICONDUCTOR DEVICE MANUFACTURING METHOD

TECHNICAL FIELD

The present disclosure relates to a thermosetting adhesive sheet for reinforcing a semiconductor wafer and preventing cracks during a dicing process and a method for manufacturing a semiconductor device. This application claims priority to Japanese Patent Application No. 2015-243649 filed on Dec. 14, 2015, the entire contents of which are hereby incorporated by reference.

BACKGROUND ART

In manufacturing processes of semiconductor chips, dicing (separation) processes cause significant stresses in semiconductor wafers. This can cause microcracks in semiconductor wafers and might increase defect rates.

To prevent such problems, applying a thermosetting adhesive sheet immediately before dicing (after backgrinding) to reinforce the semiconductor wafer has been proposed (for example, see PLT 1).

However, thinner semiconductor wafers have increased semiconductor wafer warping, which might impede dicing tape application.

CITATION LIST

Patent Literature

PLT 1: Japanese Unexamined Patent Application Publication No. 2002-280329

SUMMARY OF INVENTION

Technical Problem

In view of such conventional circumstances, an object of the present disclosure is to provide a thermosetting adhesive sheet capable of reducing semiconductor wafer warping and chipping and a method for manufacturing a semiconductor device.

Solution to Problem

In view of the above described problems, a thermosetting adhesive sheet according to the present disclosure includes a thermosetting adhesive layer formed from a resin composition containing a resin component and a filler, the resin component containing an epoxy compound and a curing agent, a total value obtained by multiplying the reciprocal of epoxy equivalent of the epoxy compound by content of the epoxy compound in the resin component being 1.15E−04 or more, and blending amount of the filler being 50 pts. mass or more with respect to 100 pts. mass of the resin component.

Furthermore, a method for manufacturing a semiconductor device according to the present disclosure includes a grinding step of grinding a semiconductor wafer, a thermosetting adhesive sheet applying step of applying a thermosetting adhesive sheet to a ground surface of the semiconductor wafer, a curing step of curing the thermosetting adhesive sheet to reduce warping of the semiconductor wafer, and a dicing step of applying a dicing tape to a side of the semiconductor wafer to which the thermosetting adhesive sheet is applied and dicing the semiconductor wafer, the thermosetting adhesive sheet including a thermosetting adhesive layer formed from a resin composition containing a resin component and a filler, the resin component containing an epoxy compound and a curing agent, a total value obtained by multiplying the reciprocal of epoxy equivalent of the epoxy compound by content of the epoxy compound in the resin component being 1.15E−04 or more, and blending amount of the filler being 50 pts. mass or more with respect to 100 pts. mass of the resin component.

Advantageous Effects of Invention

According to the present disclosure, semiconductor wafer warping can be reduced by applying the thermosetting sheet to a ground surface of the semiconductor wafer and curing to contract the thermosetting sheet. This enables increased flatness of the wafer during dicing to reduce chipping and achieve a high-quality semiconductor device.

DESCRIPTION OF EMBODIMENTS

Embodiments of the present disclosure will now be described in detail according to the following order.
1. Thermosetting Adhesive Sheet
2. Semiconductor Device Manufacturing Method
3. Examples

1. Thermosetting Adhesive Sheet

A thermosetting adhesive sheet according to this embodiment is a reinforcing sheet having a thermosetting adhesive layer to be applied to a ground surface of a semiconductor wafer when dicing the semiconductor wafer to reinforce the wafer and prevent cracks known as chipping during a dicing process.

Figure 1:
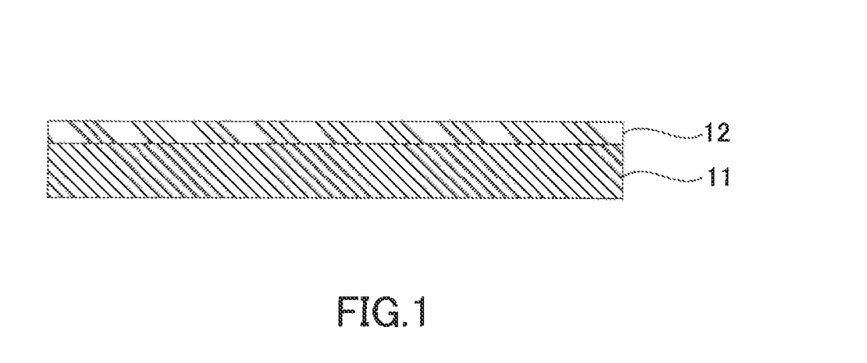
FIG. 1 is a schematic cross-sectional view illustrating a thermosetting adhesive sheet.

FIG. 1 is a schematic cross-sectional view illustrating a thermosetting adhesive sheet. As illustrated in FIG. 1, the thermosetting adhesive sheet includes a matrix film layer 11 and a thermosetting adhesive layer 12 laminated together.

Examples of the matrix film layer 11 include plastic films such as those of polyethylene terephthalate, polyethylene, polypropylene, and polyester, as well as porous matrix materials such as those of paper, cloth, and nonwoven fabric.

The thermosetting adhesive layer 12 is formed from a resin composition containing a resin component and a filler, the resin component containing an epoxy compound and a curing agent.

Examples of the epoxy compound include glycidyl ether epoxy resins such as tetrakis(glycidyloxyphenyl)ethane, tetrakis(glycidyloxymethylphenyl)ethane, tetrakis(glycidyloxyphenyl)methane, tris(glycidyloxyphenyl)ethane, and tris(glycidyloxyphenyl)methane as well as dicyclopentadiene epoxy resin, glycidylamine epoxy resin, bisphenol A epoxy resin, bisphenol F epoxy resin, bisphenol S epoxy resin, spiro ring epoxy resin, naphthalene epoxy resin, biphenyl epoxy resin, terpene epoxy resin, tetrabromobisphenol A epoxy resin, cresol novolak epoxy resin, phenol novolak epoxy resin, α-naphthol novolak epoxy resin, and brominated phenol novolak epoxy resin, among others. These epoxy resins may be used individually or in a combination of two or more. Commercial examples of the epoxy compound include trade names "jER1009" (bisphenol A epoxy resin, epoxy equivalent 2850), "jER1031 S" tetraphenylol ethane epoxy resin, epoxy equivalent 200), and "jERYL980" (liquid bisphenol A epoxy resin, epoxy equivalent 185) available from Mitsubishi Chemical Corporation.

In the present embodiment, a total value obtained by multiplying the reciprocal of epoxy equivalent of the epoxy compound by content of the epoxy compound in the resin component, that is, moles of epoxy groups for 100 pts. mass of the resin component, is $1.15E-04$ or more and preferably $1.20E-04$ to $2.00E-03$. The thermosetting adhesive layer can significantly contract to reduce semiconductor wafer warping when moles of epoxy groups for 100 pts. mass of the resin component is $1.15E-04$ or more.

Moles of epoxy groups for 100 pts. mass of the resin component can be found by the following Equation (1)

$$\text{moles of epoxy groups} = \text{reciprocal of epoxy equivalent} * \text{content in resin component}. \quad (1)$$

Herein, epoxy equivalent is the mass (g/eq) of a resin containing one equivalent of epoxy groups as measured by a method standardized in JIS K7236:2001.

Examples of the curing agent include imidazoles, polyhydric phenols, acid anhydrides, amines, hydrazides, polymercaptans, Lewis acid-amine complexes, and latent curing agents, among others. Among these, it is preferable to use a latent curing agent having excellent storage stability and imparting excellent heat tolerance to cured products. Examples of latent curing agents include dicyandiamide latent curing agents, amine adduct latent curing agents, organic acid hydrazide latent curing agents, aromatic sulfonium salt latent curing agents, microcapsule latent curing agents, and photocurable latent curing agents, among others. Among these, it is preferable to use a microcapsule latent curing agent having excellent storage stability. Examples of microcapsule latent curing agents include the above-described curing accelerators encapsulated using a vinyl compound, a urea compound, or a thermoplastic resin. Commercial examples of microcapsule latent curing agents include Novacure HX-3941HP (microcapsule latent curing agent of an amine adduct latent curing agent processed with an isocyanate) available from Asahi Kasei Chemicals Corporation.

Furthermore, the thermosetting adhesive layer 12 may contain a polymer as a film forming resin such as an elastomer and/or a phenoxy resin in the resin component Examples of elastomers include acrylic elastomers, butadiene elastomers, ethylene elastomers, propylene elastomers, and styrene elastomers; these may be used individually or in a combination of two or more. Among these, it is preferable to use an acrylic elastomer having excellent transparency. Examples of commercially available acrylic elastomers include tradename "SG-P3" manufactured by Nagase ChemteX Corporation. Examples of phenoxy resins include fluorene phenoxy resins, bisphenol phenoxy resins, novolac phenoxy resins, naphthalene phenoxy resins, and biphenyl phenoxy resins; these may be used individually or in a combination of two or more.

Furthermore, weight average molecular weight (Mw) of the polymer is preferably 5,000 to 150,000 and more preferably 10,000 to 80,000. Insufficient weight average molecular weights (Mw) tend to degrade sheet characteristics, and excessive weight average molecular weights (Mw) tend to degrade compatibility with other constituents.

Furthermore, content of the polymer in the resin component is preferably less than 15 wt % and more preferably less than 10 wt %. This is because excessive content of the polymer in the resin component tends to degrade control of wafer warping.

Furthermore, it is preferable to add a silane coupling agent to the resin component. As the silane coupling agent, (meth)acrylic-based, epoxy-based, amino-based, mercapto-based, sulfide-based, and ureido-based agents may be used; however, the present embodiment preferably uses an epoxy-based silane coupling agent. This can improve adhesion reliability at interfaces between organic and inorganic materials.

The filler may be inorganic or organic and is preferably transparent to infrared light used in alignment. Examples of materials that are transparent to infrared light include silica, silicon, germanium, quartz, and sapphire; these may be used individually or in a combination of two or more. Among these, silica is preferably used in view of laser mark visibility.

Moreover, blending amount of the filler is 50 pts. mass or more and preferably 50 to 100 pts. mass with respect to 100 pts. mass of the resin component. Insufficient blending amounts of the filler tend to degrade wafer warping reduction effects, and excessive blending amounts tend to degrade adhesion reliability.

Moreover, a colorant such as a black pigment is preferably added as another filler. The colorant enhances contrast between laser marking portions and other portions to improve laser mark visibility. Examples of such colorants include carbon black, titanium black, titanium oxide, and iron oxide; these may be used individually or in a combination of two or more. Among these, carbon black is preferably used in view of improving contrast.

Moreover, the thermosetting adhesive sheet preferably has a transmittance of 30% or more at a wavelength of 1,000 nm. Insufficient infrared transmittance would impede alignment using infrared.

According to such a thermosetting adhesive sheet, semiconductor wafer warping can be reduced by applying the thermosetting sheet to a ground surface of the semiconductor wafer and curing to contract the thermosetting sheet. This enables increased flatness of the wafer during dicing to reduce chipping and achieve a high-quality semiconductor device.

2. Semiconductor Device Manufacturing Method

Next, a method for manufacturing a semiconductor device using the above-described thermosetting adhesive sheet will be described. A method for manufacturing a semiconductor device according to the present embodiment includes a grinding step of grinding a semiconductor wafer, a thermosetting adhesive sheet applying step of applying a thermosetting adhesive sheet to a ground surface of the semiconductor wafer and curing the thermosetting adhesive sheet to reduce warping of the semiconductor wafer, and a dicing step of applying a dicing tape to a side of the semiconductor wafer to which the thermosetting adhesive sheet is applied and dicing the semiconductor wafer. Because semiconductor wafer warping can be reduced, the wafer can be diced in a state of increased flatness, thereby reducing chipping and achieving a high-quality semiconductor device.

Hereinafter, an example method for manufacturing a semiconductor device will be described. An example method for manufacturing a semiconductor device includes a protective tape applying step (A) of applying a protective tape having an adhesive agent layer, a grinding step (B), a thermosetting resin sheet applying step (C), a protective tape peeling step (D), a curing step (E), an adhesive tape applying step (F), a dicing step (G), an expanding step (H), a picking-up step (I), and a mounting step (J). It should be noted that the protective tape peeling step (D) may be performed before the thermosetting resin sheet applying step (C).

(A) Protective Tape Applying Step

Figure 2:
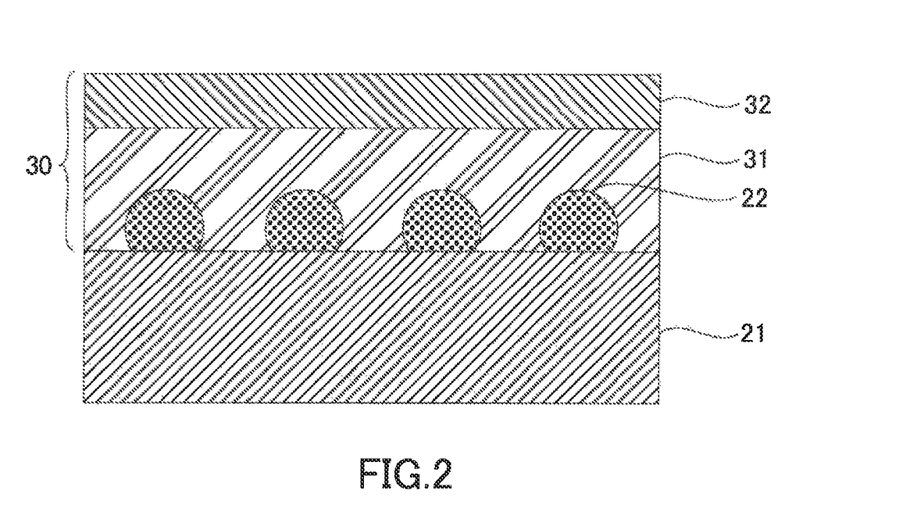
FIG. 2 is a schematic cross-sectional view illustrating a BG tape applying step.

FIG. 2 is a schematic cross-sectional view illustrating a protective tape applying step. The protective tape applying step includes applying a protective tape 30 to a surface of a wafer 21 having a protruding electrode 22 formed thereon. The application temperature for applying the protective tape 30 is preferably 25 to 100° C. and more preferably 40 to 80° C. in view of reducing voids, improving wafer adhesion properties, and preventing warping of the wafer after grinding.

The wafer 21 includes an integrated circuit formed on a surface of a semiconductor such as silicon and the protruding electrode 22, which is known as a bump and used for connecting. Thickness of the wafer 21 is without particular limitation but is preferably 200 to 1,000 µm.

Examples of the protruding electrode 22 include, without particular limitation, solder-containing low-melting point bumps or high-melting point bumps, tin bumps, silver-tin bumps, silver-tin-copper bumps, gold bumps, and copper bumps. Moreover, height of the protruding electrode 22 is without particular limitation but is preferably 10 to 200 µm.

The protective tape 30 is known as backgrind tape and protects the wafer from scratches, cracks, and contamination in the following grinding step (B). As illustrated in FIG. 2, the protective tape 30 has a thermoplastic resin layer 31 and a matrix film layer 32 laminated together and is applied so that the thermoplastic resin layer 31 contacts the surface on which the protruding electrode 22 is formed, and the protruding electrode 22 embeds into the thermoplastic resin layer 31.

Examples of the thermoplastic resin layer 31 include ethylene vinyl acetate copolymer (EVA), polyethylene, polypropylene, polyamide, polyacetal, polyethylene terephthalate, polybutylene terephthalate, fluoropolymer, polyphenylene sulfide, polystyrene, ABS resin, acrylic resin, polycarbonate, polyurethane, polyvinyl chloride, and polyphenylene oxide, among others; these may be used individually or in a combination of two or more.

Examples of the matrix film layer 32 include plastic films such as those of polyethylene terephthalate, polyethylene, polypropylene, and polyester, as well as porous matrix materials such as those of paper, cloth, and nonwoven fabric.

It should be noted that the protective tape 30 is not limited to the configuration described above, and other layers may be formed on the surface of any layer or between any adjacent layers.

(B) Grinding Step

Figure 3:
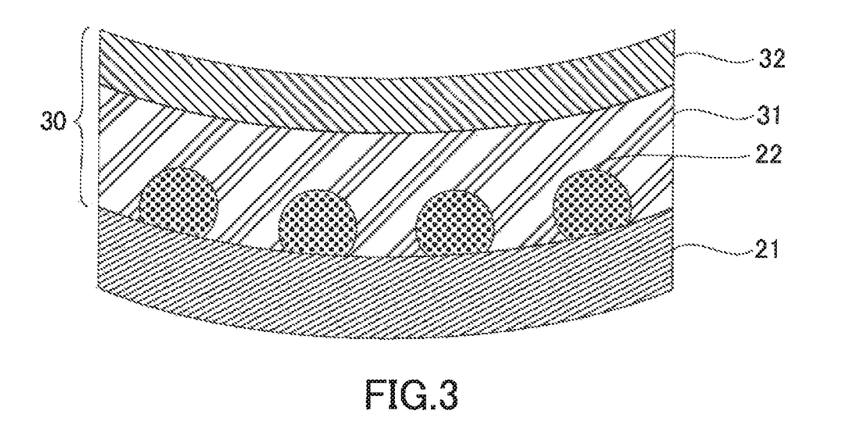
FIG. 3 is a schematic cross-sectional view illustrating a grinding step.

FIG. 3 is a schematic cross-sectional view illustrating a grinding step. The grinding step includes grinding a surface opposite to an application-surface of the protective tape 30. With the protective tape 30 applied on one side, the wafer 21 is secured to a grinding device and ground on the other side. In the grinding step, the wafer 21 is ground to a thickness of 200 µm or less and may be ground to a thickness of 50 µm or less. Decreasing thickness of the wafer 21 increases warping of the wafer 21. It should be noted that warping of the wafer 21 is measured as the maximum value of the warp (z-axis) when the wafer 21 is placed on a planar stage (x-y plane).

(C) Thermosetting Adhesive Sheet Applying Step

Figure 4:
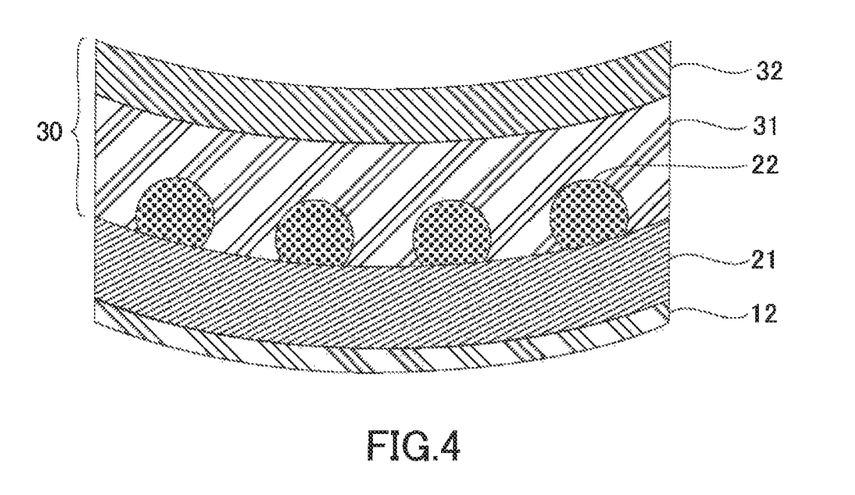
FIG. 4 is a schematic cross-sectional view illustrating a thermosetting adhesive sheet application step.

FIG. 4 is a schematic cross-sectional view illustrating a thermosetting adhesive sheet applying step. The thermosetting adhesive sheet applying step includes applying a thermosetting adhesive layer 12 of the thermosetting adhesive sheet to the ground surface of the wafer 21.

(D) Protective Tape Peeling Step

Figure 5:
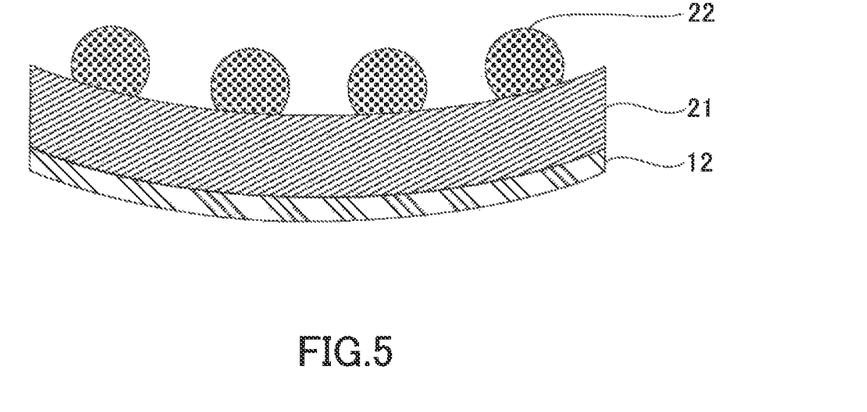
FIG. 5 is a schematic cross-sectional view illustrating a BG tape peeling step.

FIG. 5 is a schematic cross-sectional view illustrating a protective tape peeling step. The protective tape peeling step includes peeling the protective tape 30.

(E) Curing Step

Figure 6:
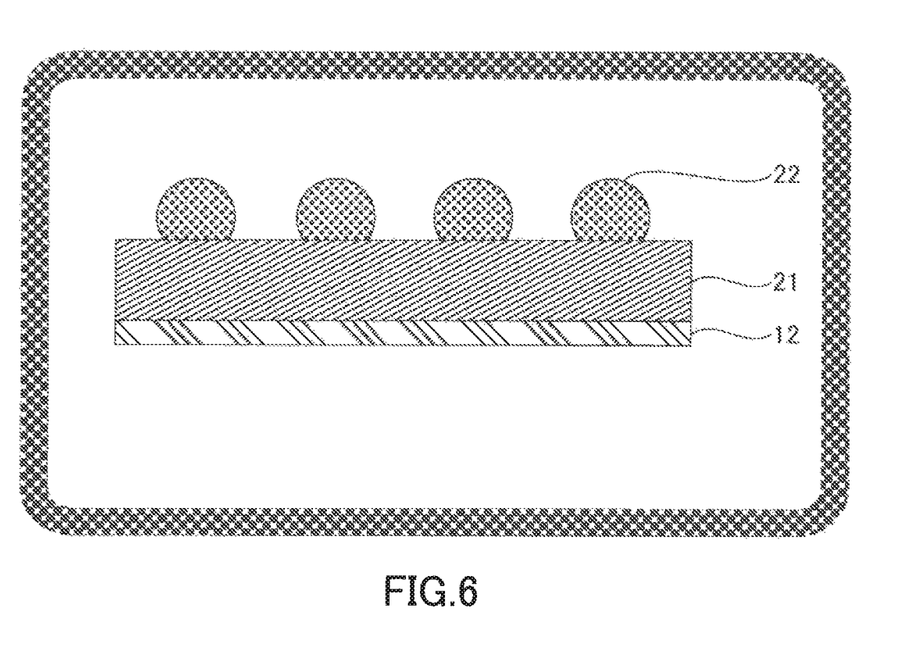
FIG. 6 is a schematic cross-sectional view illustrating a curing step.

FIG. 6 is a schematic cross-sectional view illustrating a curing step. The curing step includes curing the thermosetting adhesive layer 12. As a curing method and conditions, known methods for curing thermosetting adhesive agents may be used. For example, the thermosetting adhesive layer 12 can be cured at a temperature of 80 to 200° C. for 0.1 to 5 hours in the curing step. This significantly contracts the thermosetting adhesive layer 12 and generates stress opposing the warp direction of the wafer 21, which can maintain flatness of the wafer 21.

(F) Adhesive Tape Applying Step

Figure 7:
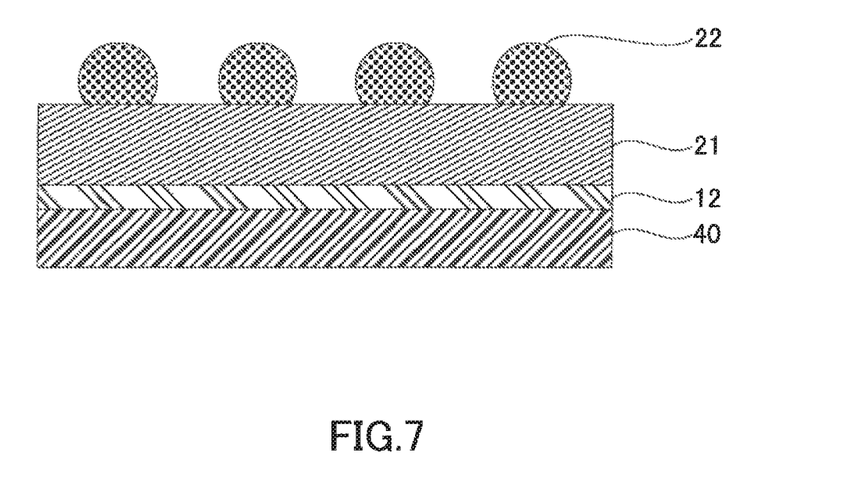
FIG. 7 is a schematic cross-sectional view illustrating a DC tape applying step.

FIG. 7 is a schematic cross-sectional view illustrating an adhesive tape applying step. The adhesive tape applying step includes applying an adhesive tape 40 onto the ground surface. The adhesive tape 40, known as dicing tape, protects and secures the wafer 21 from the dicing step (G) through the picking-up step (1).

The adhesive tape 40 is without particular limitation and known adhesive tapes may be used. Typically, the adhesive tape 40 has an adhesive layer and a matrix film layer. Examples of the adhesive layer include polyethylene-based, acrylic-based, rubber-based, and urethane-based adhesives. Moreover, examples of the matrix film layer include plastic films such as those of polyethylene terephthalate, polyethylene, polypropylene, and polyester, as well as porous matrix materials such as those of paper, cloth, and nonwoven fabric. The application device as well as conditions for applying the adhesive tape are without particular limitations, and well-known devices and conditions may be employed.

(G) Dicing Step

Figure 8:
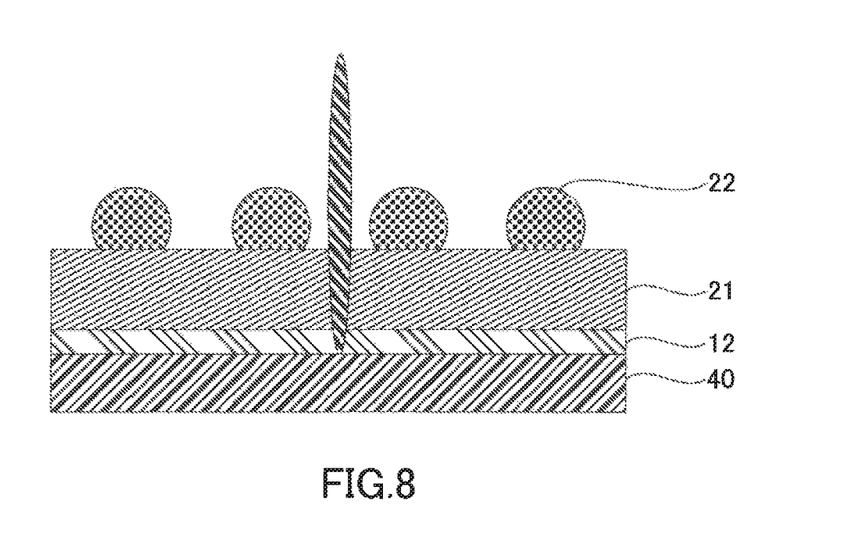
FIG. 8 is a schematic cross-sectional view illustrating a dicing step.

FIG. 8 is a schematic cross-sectional view illustrating a dicing step. The dicing step includes dicing the wafer 21, having the adhesive tape 40 applied thereon, to obtain individual semiconductor chips. The dicing method is without particular limitation, and known methods such as, for example, cutting the wafer 21 apart with a dicing saw may be employed. Because the thermosetting adhesive sheet reduces wafer warping, the wafer can be diced in a state of increased flatness and chipping can be reduced.

(H) Expanding Step

Figure 9:
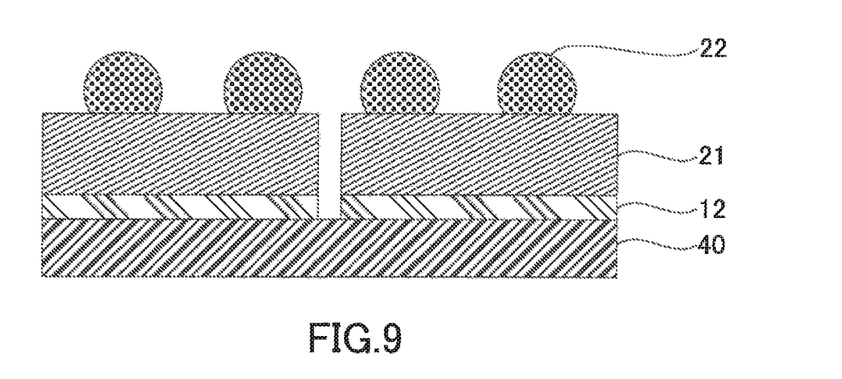
FIG. 9 is a schematic cross-sectional view illustrating an expanding step.

FIG. 9 is a schematic cross-sectional view illustrating an expanding step. The expanding step includes radially expanding the adhesive tape 40, on which separated individual semiconductor chips are adhered, to increase distances between the individual semiconductor chips.

(I) Picking-up Step

Figure 10:
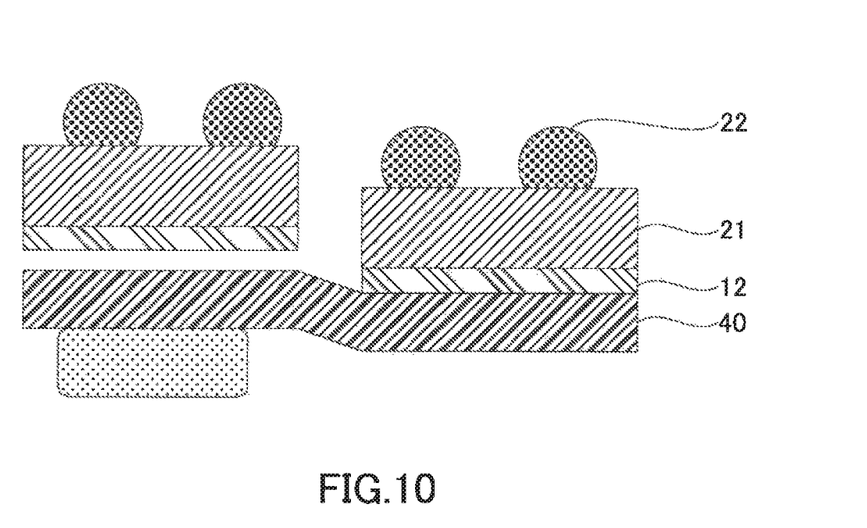
FIG. 10 is a schematic cross-sectional view illustrating a picking-up step.

FIG. 10 is a schematic cross-sectional view illustrating a picking-up step. The picking-up step includes pressing the underside surface of the adhesive tape 40 to detach the semiconductor chips secured to the adhesive tape 40 and suctioning up the detached semiconductor chips with a collet. The picked-up semiconductor chips are collected in a chip tray or conveyed to a chip-mounting nozzle of a flip-chip bonder.

(J) Mounting Step

Figure 11:
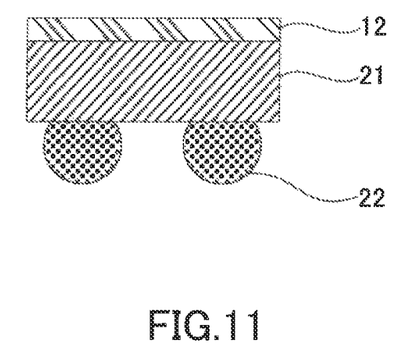
FIG. 11 is a schematic cross-sectional view illustrating a mounting step.

FIG. 11 is a schematic cross-sectional view illustrating a mounting step. The mounting step includes, for example, connecting the semiconductor chip and a circuit substrate using a circuit connecting material such as NCF (non-conductive film). Examples of the circuit substrate, without particular limitation, include plastic substrates such as polyimide substrates and glass epoxy substrates as well as ceramic substrates. Furthermore, as a connection method, known methods such as those using thermal-bonding or reflow ovens can be used.

According to such a method for manufacturing a semiconductor device, applying the thermosetting adhesive sheet to a ground surface of the semiconductor wafer and curing reduces warping of the semiconductor wafer, which can suppress chipping and facilitate dicing.

EXAMPLES

Hereinafter, examples according to the present disclosure will be described. In the present examples, thermosetting adhesive sheets were prepared and applied to patterned wafers in which warping had occurred to prepare laminated bodies. Then, film-formation properties of the thermosetting adhesive sheets, suppression of chipping during dicing, and control of wafer warping were evaluated.

Thermosetting Adhesive Sheet Preparation

The components listed below were blended to prepare resin compositions. These were applied to release-treated PET (polyethylene terephthalate) using a bar coater and then dried in an oven at 80° C. for 3 minutes to prepare thermosetting adhesive sheets having a thermosetting adhesive layer at a thickness of 20 μm (cover release-treated PET (25 μm)/thermosetting adhesive layer (20 μm)/base release-treated PET (50 μm)).

jER1009: bisphenol A epoxy resin (Mitsubishi Chemical Corporation, epoxy equivalent 2850)

jER1031 S: tetraphenylol ethane epoxy resin (Mitsubishi Chemical Corporation, epoxy equivalent 200)

jERYL980: liquid bisphenol A epoxy resin (Mitsubishi Chemical Corporation, epoxy equivalent 185)

Novacure HX-3941 HP: microcapsule latent curing agent of an amine adduct latent curing agent processed with isocyanate (Asahi Kasei Chemicals Corporation)

A-187: epoxy-based silane coupling agent (Momentive Performance Materials Japan LLC)

SG-P3: elastomer (Nagase ChemteX Corporation)

Aerosil R202: silica (NIPPON AEROSIL CO., LTD)

3050B: carbon black (Mitsubishi Chemical Corporation)

Laminated Body Preparation

Thermosetting adhesive layers having a thickness of 20 μm were applied onto patterned wafers with a press and cured at 180° C. for one hour to obtain laminated bodies.

Eight-inch patterned wafers having a thickness of 200 μm were used. Furthermore, average warping of the patterned wafers (sample size: 10) was 4 mm. Warping of the patterned wafers was measured as the maximum value of the warp (z-axis) when one of the patterned wafers was placed on a planar stage (x-y plane).

Evaluation of Film-formation Properties

The thermosetting adhesive sheets were evaluated for film properties, tackiness, and lamination properties and evaluated as "A" when favorable in each respect, "B" when favorable in film properties but unfavorable in tackiness, and "C" when otherwise.

Evaluation of Chipping Suppression During Dicing

Dicing tape was laminated on the thermosetting adhesive layer side of the laminated bodies, and the laminated bodies were observed after dicing. Cases of less than 5% defects due to chipping were evaluated as "A," and cases of 5% or more as "B."

Evaluation of Wafer Warping Control

As in measurement of warping of the patterned wafers, warping of the laminated bodies was measured as the maximum value of the warp (z-axis) when one of the laminated bodies was placed on a planar stage (x-y plane). Laminated bodies having less than 1.0 mm of warping were evaluated as "A," laminated bodies having 1.0 to 1.5 mm or less of warping were evaluated as "B," laminated bodies having 1.5 to 2.5 mm or less of warping were evaluated as "C," and laminated bodies having 2.5 mm or more of warping were evaluated as "D."

Example 1

As represented in Table 1, a resin composition was prepared having 100 pts. mass of a resin component containing 39 pts. mass of a solid epoxy compound (jER1009), 60 pts. mass of a curing agent (HX-3941HP), and 1 pts. mass of a coupling agent (A-187), to which 80 pts. mass of silica (Aerosil R202) was added. Moles of epoxy groups for 100 pts. mass of the resin component was 1.368E−04, and blending amount of the filler was 80 pts. mass with respect to 100 pts. mass of the resin component. Thermosetting adhesive sheets prepared using this resin composition were evaluated as A for film-formation properties, B for suppression of chipping during dicing, and B for control of wafer warping.

Example 2

As represented in Table 1, a resin composition was prepared having 100 pts. mass of a resin component containing 38 pts. mass of a solid epoxy compound (jER1009), 59 pts. mass of a curing agent (HX-3941HP), and 1 pts. mass of a coupling agent (A-187), to which 80 pts. mass of silica (Aerosil R202) and 2 pts. mass carbon black was added. Moles of epoxy groups for 100 pts. mass of the resin component was 1.361E−04, and blending amount of the filler was 82 pts. mass with respect to 100 pts. mass of the resin component. Thermosetting adhesive sheets prepared using this resin composition were evaluated as A for film-formation properties, B for suppression of chipping during dicing, and B for control of wafer warping.

Example 3

As represented in Table 1, a resin composition was prepared having 100 pts. mass of a resin component containing 32 pts. mass of a polyfunctional solid epoxy compound (jER1031S), 67 pts. mass of a curing agent (HX-3941HP), and 1 pts. mass of a coupling agent (A-187), to which 80 pts. mass of silica (Aerosil R202) was added. Moles of epoxy groups for 100 pts. mass of the resin component was 1.600E−03, and blending amount of the filler was 80 pts. mass with respect to 100 pts. mass of the resin component. Thermosetting adhesive sheets prepared using this resin composition were evaluated as A for film-formation properties, B for suppression of chipping during dicing, and A for control of wafer warping.

Example 4

As represented in Table 1, a resin composition was prepared having 100 pts. mass of a resin component containing 35 pts. mass of a polyfunctional solid epoxy compound (jER1009), 4 pts. mass of a polyfunctional liquid epoxy compound, 60 pts. mass of a curing agent (HX-3941HP), and 1 pts. mass of a coupling agent (A-187), to which 80 pts. mass of silica (Aerosil R202) was added. Moles of epoxy groups for 100 pts. mass of the resin component was 3.390E−04, and blending amount of the filler was 80 pts. mass with 1o respect to 100 pts. mass of the resin component. Thermosetting adhesive sheets prepared using this resin composition were evaluated as B for film-formation properties, A for suppression of chipping during dicing, and A for control of wafer warping.

Example 5

As represented in Table 1, a resin composition was prepared having 90 pts. mass of a resin component containing 34 pts. mass of a polyfunctional solid epoxy compound (jER1009), 55 pts. mass of a curing agent (HX-3941HP), and 1 pts. mass of a coupling agent (A-187), to which 50 pts. mass of silica (Aerosil R202) was added. Moles of epoxy groups for 100 pts. mass of the resin component was 1.326E−04, and blending amount of the filler was 56 pts. mass with respect to 100 pts. mass of the resin component. Thermosetting adhesive sheets prepared using this resin composition were evaluated as A for film-formation properties, A for suppression of chipping during dicing, and A for control of wafer warping.

Example 6

As represented in Table 1, a resin composition was prepared having 95 pts. mass of a resin component containing 34 pts. mass of a polyfunctional solid epoxy compound (jER1009), 55 pts. mass of a curing agent (HX-3941HP), 1 pts. mass of a coupling agent (A-187), and 5 pts. mass of an elastomer, to which 80 pts. mass of silica (Aerosil R202) was added. Moles of epoxy groups for 100 pts. mass of the resin component was 1.256E−04, and blending amount of the filler was 84 pts. mass with respect to 100 pts. mass of the resin component. Moreover, blending amount of the elastomer in the resin component was 5 wt %. Thermosetting adhesive sheets prepared using this resin composition were evaluated as A for film-formation properties, A for suppression of chipping during dicing, and A for control of wafer warping.

Example 7

As represented in Table 1, a resin composition was prepared having 100 pts. mass of a resin component containing 34 pts. mass of a polyfunctional solid epoxy compound (jER1009), 55 pts. mass of a curing agent (HX-3941HP), 1 pts. mass of a coupling agent (A-187), and 10 pts. mass of an elastomer, to which 80 pts. mass of silica (Aerosil R202) was added. Moles of epoxy groups for 100 pts. mass of the resin component was 1.193E−04, and blending amount of the filler was 80 pts. mass with respect to 100 pts. mass of the resin component. Moreover, blending amount of the elastomer in the resin component was 10 wt %. Thermosetting adhesive sheets prepared using this resin composition were evaluated as A for film-formation properties, A for suppression of chipping during dicing, and B for control of wafer warping.

Comparative Example 1

As represented in Table 1, a resin composition was prepared having 100 pts. mass of a resin component containing 34 pts. mass of a polyfunctional solid epoxy compound (jER1009), 55 pts. mass of a curing agent (HX-3941HP), 1 pts. mass of a coupling agent (A-187), and 10 pts. mass of an elastomer, to which 30 pts. mass of silica (Aerosil R202) was added. Moles of epoxy groups for 100 pts. mass of the resin component was 1.193E−04, and blending amount of the filler was 30 pts. mass with respect to 100 pts. mass of the resin component. Moreover, blending amount of the elastomer in the resin component was 10 wt %. Thermosetting adhesive sheets prepared using this resin composition were evaluated as B for film-formation properties, B for suppression of chipping during dicing, and C for control of wafer warping.

Comparative Example 2

As represented in Table 1, a resin composition was prepared having 105 pts. mass of a resin component containing 34 pts. mass of a polyfunctional solid epoxy compound (jER1009), 55 pts. mass of a curing agent (HX-3941HP), 1 pts. mass of a coupling agent (A-187), and 15 pts. mass of an elastomer, to which 80 pts. mass of silica (Aerosil R202) was added. Moles of epoxy groups for 100 pts. mass of the resin component was 1.136E−04, and blending amount of the filler was 76 pts. mass with respect to 100 pts. mass of the resin component. Moreover, blending amount of the elastomer in the resin component was 15 wt %. Thermosetting adhesive sheets prepared using this resin composition were evaluated as A for film-formation properties, B for suppression of chipping during dicing, and C for control of wafer warping.

TABLE 1

| Component | Epoxy equivalent | Trade name | Ex. 1 | Ex. 2 | Ex. 3 | Ex. 4 | Ex. 5 |
|---|---|---|---|---|---|---|---|
| Solid epoxy | 2850 | Epikote 1009 | 39 | 38 | — | 35 | 34 |
| Polyfunctional solid epoxy | 200 | Epikote 1031S | — | — | 32 | — | — |

TABLE 1-continued

| Component | Epoxy equivalent | Trade name | | | | | |
|---|---|---|---|---|---|---|---|
| Polyfunctional liquid epoxy | 185 | YL980 | — | — | — | 4 | — |
| Curing agent | | HX-3941HP | 60 | 59 | 67 | 60 | 55 |
| Coupling agent | | A-187 | 1 | 1 | 1 | 1 | 1 |
| Elastomer | | SG-P3 | — | — | — | — | — |
| Resin component [pts. mass] | | | 100 | 100 | 100 | 100 | 90 |
| Silica | | Aerosil R202 | 80 | 80 | 80 | 80 | 50 |
| Carbon black | | #3050B | — | 2 | — | — | — |
| Moles of epoxy groups for 100 pts. mass resin component | | | 1.368E−04 | 1.361E−04 | 1.600E−03 | 3.390E−04 | 1.326E−04 |
| Filler blending amount to 100 pts. mass resin component [pts. mass] | | | 80 | 82 | 80 | 80 | 56 |
| Elastomer content per 100 pts. mass resin component [wt %] | | | 0 | 0 | 0 | 0 | 0 |
| Film formation properties evaluation | | | A | A | A | B | A |
| Chipping suppression during dicing evaluation | | | B | B | B | A | A |
| Thin wafer warping control evaluation | | | B | B | A | A | A |

| Component | Epoxy equivalent | Trade name | Ex. 6 | Ex. 7 | Comp. 1 | Comp. 2 |
|---|---|---|---|---|---|---|
| Solid epoxy | 2850 | Epikote 1009 | 34 | 34 | 34 | 34 |
| Polyfunctional solid epoxy | 200 | Epikote 1031S | — | — | — | — |
| Polyfunctional liquid epoxy | 185 | YL980 | — | — | — | — |
| Curing agent | | HX-3941HP | 55 | 55 | 55 | 55 |
| Coupling agent | | A-187 | 1 | 1 | 1 | 1 |
| Elastomer | | SG-P3 | 5 | 10 | 10 | 15 |
| Resin component [pts. mass] | | | 95 | 100 | 100 | 105 |
| Silica | | Aerosil R202 | 80 | 80 | 30 | 80 |
| Carbon black | | #3050B | — | — | — | — |
| Moles of epoxy groups for 100 pts. mass resin component | | | 1.256E−04 | 1.193E−04 | 1.193E−04 | 1.136E−04 |
| Filler blending amount to 100 pts. mass resin component [pts. mass] | | | 84 | 80 | 30 | 76 |
| Elastomer content per 100 pts. mass resin component [wt %] | | | 5 | 10 | 10 | 15 |
| Film formation properties evaluation | | | A | A | B | A |
| Chipping suppression during dicing evaluation | | | A | A | B | B |
| Thin wafer warping control evaluation | | | A | B | C | C |

As in Comparative Example 1, insufficient filler caused low contraction in the thermosetting adhesive sheets and inability to reduce wafer warping. Furthermore, as in Comparative Example 2, excessive blending amount of the elastomer and less than 1.15E−04 moles of epoxy groups for 100 pts. mass of the resin component caused low contraction in the thermosetting adhesive sheets and inability to reduce wafer warping.

In contrast, as in Examples 1 to 7, when the moles of epoxy groups for 100 pts. mass of the resin component was 1.15E−04 or more and the blending amount of the filler with respect to 100 pts. mass of the resin component was 50 pts. mass or more, contraction in the thermosetting adhesive sheets was high, and wafer warping could be significantly reduced. Thereby, the wafer could be diced in a state of increased flatness, which significantly reduced chipping. Furthermore, as in Examples 6 and 7 as well as Comparative Example 2, it was found that excessive blending amounts of the elastomer in the resin composition degraded wafer warping control.

REFERENCE SIGNS LIST

11 matrix film layer, 12 thermosetting adhesive layer, 21 wafer, 22 protruding electrode, 30 protective tape, 31 thermoplastic resin layer, 32 matrix film layer

The invention claimed is:

1. A thermosetting adhesive sheet comprising:
a thermosetting adhesive layer formed from a resin composition containing a resin component and a filler, the resin component containing an epoxy compound, an elastomer and a curing agent,
wherein a total value obtained by multiplying the reciprocal of epoxy equivalent of the epoxy compound by content of the epoxy compound in the resin component is 1.20E−04 to 3.39E−04,
wherein a blending amount of the filler is 50 pts. mass or more with respect to 100 pts. mass of the resin component,
wherein a content of the elastomer in the resin component is less than 15 wt %,
wherein the curing agent is a microcapsule comprised of a latent curing agent of an amine adduct latent curing agent processed with an isocyanate,
wherein a content of the epoxy compound in the resin component is 32 to 39 wt %, and
wherein a blending amount of the microcapsule latent curing agent is larger than a blending amount of the epoxy compound in the resin composition.

2. The thermosetting adhesive sheet according to claim 1, wherein the content of the elastomer in the resin component is 10 wt % or less.

3. The thermosetting adhesive sheet according to claim 1, wherein the blending amount of the filler is 50 to 100 pts. mass with respect to 100 pts. mass of the resin component.

4. The thermosetting adhesive sheet according to claim 1, wherein the filler includes a black pigment.

5. The thermosetting adhesive sheet according to claim 3, wherein the filler includes a black pigment.

6. The thermosetting adhesive sheet according to claim 2, wherein the blending amount of the filler is 50 to 100 pts. mass with respect to 100 pts. mass of the resin component.

7. The thermosetting adhesive sheet according to claim 2, wherein the filler includes a black pigment.

8. The thermosetting adhesive sheet according to claim 1, wherein the epoxy compound comprises a bisphenol A type solid epoxy resin or a tetraphenylol ethane type solid epoxy resin.

9. A method for manufacturing a semiconductor device comprising:
- a grinding step of grinding a semiconductor wafer;
- a thermosetting adhesive sheet applying step of applying a thermosetting adhesive sheet to a ground surface of the semiconductor wafer;
- a curing step of curing the thermosetting adhesive sheet to reduce warping of the semiconductor wafer;
- a dicing tape applying step of applying a dicing tape to a side of the semiconductor wafer to which the thermosetting adhesive sheet is applied; and
- a dicing step of dicing the semiconductor wafer to which the dicing tape is applied to obtain individual semiconductor chips,
- wherein the thermosetting adhesive sheet comprises a thermosetting adhesive layer formed from a resin composition containing a resin component and a filler, the resin component containing an epoxy compound, an elastomer and a curing agent,
- wherein a total value obtained by multiplying the reciprocal of epoxy equivalent of the epoxy compound by content of the epoxy compound in the resin component is $1.20\text{E}{-}04$ to $3.39\text{E}{-}04$,
- wherein a blending amount of the filler is 50 pts. mass or more with respect to 100 pts. mass of the resin component,
- wherein a content of the elastomer in the resin component is less than 15 wt %,
- wherein the curing agent is a microcapsule comprised of a latent curing agent of an amine adduct latent curing agent processed with an isocyanate,
- wherein a content of the epoxy compound in the resin component is 32 to 39 wt %, and
- wherein a blending amount of the microcapsule latent curing agent is larger than a blending amount of the epoxy compound in the resin composition.

10. The method for manufacturing a semiconductor device according to claim 9, wherein the grinding step includes grinding to a thickness of 200 μm or less.

11. The method for manufacturing a semiconductor device according to claim 9, wherein the epoxy compound comprises a bisphenol A type solid epoxy resin or a tetraphenylol ethane type solid epoxy resin.

* * * * *